(12) United States Patent
Huang et al.

(10) Patent No.: US 10,787,751 B2
(45) Date of Patent: Sep. 29, 2020

(54) ELECTROLYTIC COPPER FOIL WITH LOW PROFILE

(71) Applicant: CHANG CHUN PETROCHEMICAL CO., LTD., Taipei (TW)

(72) Inventors: Jian-Ming Huang, Taipei (TW); Yao-Sheng Lai, Taipei (TW); Jui-Chang Chou, Taipei (TW)

(73) Assignee: CHANG CHUN PETROCHEMICAL CO., LTD., Taipei (TW)

(*) Notice: Subject to any disclaimer, the term of this patent is extended or adjusted under 35 U.S.C. 154(b) by 0 days.

(21) Appl. No.: 16/694,412

(22) Filed: Nov. 25, 2019

(65) Prior Publication Data

US 2020/0248328 A1 Aug. 6, 2020

Related U.S. Application Data

(60) Provisional application No. 62/800,263, filed on Feb. 1, 2019.

(51) Int. Cl.
*B21C 37/00* (2006.01)
*C25D 1/04* (2006.01)
(Continued)

(52) U.S. Cl.
CPC .............. *C25D 1/04* (2013.01); *B32B 15/08* (2013.01); *B32B 15/20* (2013.01); *C25D 3/38* (2013.01); *C25D 5/10* (2013.01); *H05K 1/0242* (2013.01); *H05K 1/09* (2013.01); *H05K 1/181* (2013.01); *B32B 2255/06* (2013.01); *B32B 2255/205* (2013.01); *H05K 2201/0338* (2013.01);
(Continued)

(58) Field of Classification Search
None
See application file for complete search history.

(56) References Cited

U.S. PATENT DOCUMENTS 9,899,683 B2  2/2018  Lee et al.
10,205,170 B1  2/2019  Huang et al.
(Continued)

FOREIGN PATENT DOCUMENTS

CN  2752274 Y  1/2006
CN  1995469 A  7/2007
(Continued)

OTHER PUBLICATIONS

Non-Final Office Action for U.S. Appl. No. 16/429,921, dated Aug. 23, 2019.
(Continued)

*Primary Examiner* — Seth Dumbris
(74) *Attorney, Agent, or Firm* — Nixon Peabody LLP; Thomas P. Pavelko

(57) ABSTRACT

Surface-treated copper foils comprising an electrodeposited copper foil including a drum side and a deposited side are reported. The treatment layer is disposed on one of the drum side and the deposited side and provides a surface-treated side. The treatment layer comprises a nodule layer and the surface-treated side exhibits a void volume (Vv) in a range of 0.1 to 0.9 μm³/μm². The surface-treated copper foil also has a combined hydrogen and oxygen content of less than or equal to 300 ppm.

20 Claims, 3 Drawing Sheets

(51) Int. Cl.
  *B32B 15/08* (2006.01)
  *B32B 15/20* (2006.01)
  *C25D 3/38* (2006.01)
  *C25D 5/10* (2006.01)
  *H05K 1/18* (2006.01)
  *H05K 1/02* (2006.01)
  *H05K 1/09* (2006.01)

(52) U.S. Cl.
  CPC .............. *H05K 2201/0355* (2013.01); *H05K 2201/10522* (2013.01); *Y10T 428/12431* (2015.01)

(56) References Cited

U.S. PATENT DOCUMENTS

| | | | |
|---|---|---|---|
| 10,424,793 | B2 | 9/2019 | Cheng et al. |
| 2004/0029006 | A1 | 2/2004 | Otsuka et al. |
| 2006/0210823 | A1 | 9/2006 | Sano et al. |
| 2008/0280159 | A1* | 11/2008 | Iwakiri .............. C25D 7/06 428/687 |
| 2011/0127074 | A1* | 6/2011 | Takahashi .......... C25D 3/38 174/257 |
| 2012/0111733 | A1 | 5/2012 | Tsai et al. |
| 2013/0011690 | A1* | 1/2013 | Arai .................. C25D 5/16 428/548 |
| 2014/0264417 | A1 | 9/2014 | Kobayashi et al. |
| 2016/0264417 | A1 | 9/2016 | Bouillon et al. |
| 2017/0320247 | A1 | 11/2017 | Aizawa et al. |
| 2018/0245230 | A1 | 8/2018 | Sonoa et al. |
| 2018/0261850 | A1 | 9/2018 | Kim et al. |
| 2018/0282890 | A1 | 10/2018 | Chun et al. |
| 2019/0245014 | A1 | 8/2019 | Park et al. |
| 2019/0249322 | A1 | 8/2019 | Lee et al. |

FOREIGN PATENT DOCUMENTS

| | | |
|---|---|---|
| CN | 101098005 A | 1/2008 |
| CN | 101669237 A | 3/2010 |
| CN | 102418129 A | 4/2012 |
| CN | 102965698 A | 3/2013 |
| CN | 103911633 A | 7/2014 |
| CN | 104812945 A | 7/2015 |
| CN | 104884409 A | 9/2015 |
| CN | 105814242 A | 7/2016 |
| CN | 105986288 A | 10/2016 |
| CN | 106455341 A | 2/2017 |
| CN | 108124392 A | 6/2018 |
| CN | 108306022 A | 7/2018 |
| CN | 108345195 A | 7/2018 |
| CN | 108728874 A | 11/2018 |
| CN | 110004467 A | 7/2019 |
| EP | 3067442 A1 | 9/2016 |
| JP | 2000119892 A | 4/2000 |
| JP | 2001192879 A | 7/2001 |
| JP | 2012136736 A | 7/2012 |
| JP | 2012172198 A | 9/2012 |
| JP | 2016009526 A | 1/2016 |
| JP | 2018028147 A | 2/2018 |
| KR | 10-2015-0062230 A | 6/2015 |
| KR | 20180080512 A | 7/2018 |
| TW | 201219606 A | 5/2012 |
| TW | 417424 A | 12/2013 |
| TW | 201738413 A | 1/2017 |
| TW | 201716594 A | 5/2017 |
| TW | 201726961 A | 8/2017 |
| TW | 201832922 A | 9/2018 |
| TW | 201834303 A | 9/2018 |
| WO | 2018207786 A1 | 11/2008 |
| WO | 2014065431 A1 | 5/2014 |
| WO | 2017051767 A1 | 9/2017 |
| WO | 2018110579 A1 | 6/2018 |

OTHER PUBLICATIONS

Chein-Ho Huang et al., "Pulsed Deposition of Ultra-thin Copper Foils", Plating & Surface Finishing, Sep. 2004, 34-38.
Notice of Allowance for U.S. Appl. No. 16/429,921, dated Dec. 12, 2019.
Non-Final Office Action for U.S. Appl. No. 16/654,723, dated Jan. 3, 2020.
Valery Belov et al., "Correlation between 3d texture of steel substrate and tin-coated surface with various coating masses", Key Engineering Materials ISSN: 1662-9795, vol. 769, pp. 120-127.
Notice of Allowance for U.S. Appl. No. 16/584,157, dated Jan. 15, 2020.
Non-Final Office Action for U.S. Appl. No. 16/694,434, dated Jan. 29, 2020.
Non-Final Office Action for U.S. Appl. No. 16/715,284, dated Feb. 18, 2020.
Final Office Action for U.S. Appl. No. 16/654,723, dated Apr. 7, 2020.
Gadelmawla et al., "Roughness Parameters", Jan. 14, 2002, Journal of Materials Processing Technology, 123 (Year 2002), pp. 133-145.
Ficker et al., "Surface Roughness and Porosity of Hydrated Cement Pastes", 2011, Acta Polytechnica vol. 51 No. 3 (Year: 2011), pp. 1-14.
Office Action for TW109101362 dated Mar. 18, 2020.
International Search Report for PCT/CN2020/072158 dated Apr. 8, 2020.
International Search Report for PCT/CN2020/072157 dated Apr. 21, 2020.
TW Notice of Allowance for Application No. 109101364 dated May 25, 2020.
TW Notice of Allowance for Application No. 109101373 dated Jun. 15, 2020.
European Search Report for Application No. 20152064.0 dated Jun. 5, 2020.
International Search Report for Application No. PCT/CN2020/072282 dated Apr. 15, 2020.
International Search Report for Application No. PCT/CN2020/072305 dated Apr. 13, 2020.

* cited by examiner

ELECTROLYTIC COPPER FOIL WITH LOW PROFILE

CROSS REFERENCE TO RELATED APPLICATIONS

This application claims the benefit under 35 U.S. C. § 119(e) of U.S. Provisional Application No. 62/800,263 filed Feb. 1, 2019, the contents of which are incorporated herein by reference in their entirety.

FIELD OF THE INVENTION

The present disclosure relates to electrodeposited copper foils having controlled surface properties. The disclosure also relates to circuit boards and the like which exhibit low transmission loss of electrical signals and which incorporate the electrodeposited copper foils as a component thereof.

BACKGROUND

The increasing demands for transmitting massive data requires ever increasing signal transmission speeds between components on circuit boards. To achieve these speeds, frequency ranges are necessarily increasing from below 1 MHz to, 1 GHz, 10 GHz or even higher. In these higher ranges, the currents flow mostly near the surface of the conductor due to the well-known "skin effect" which is the tendency of high frequency current density to be highest at the surface of a conductor and to decay exponentially towards the center. The skin depth, where approximately 67% of the signal is carried, is inversely proportional to the square root of the frequency. Accordingly, at 1 MHz the skin depth is 65.2 µm, at 1 GHz it is 2.1 µm, while at 10 GHz the skin depth is only 0.7 µm. At the higher frequencies, the surface topography or roughness of the conductor becomes ever more important since a roughness on the order of, or greater than, the skin depth will impact the signal transmission.

Very Low Profile (VLP) copper foil has a very low roughness. This provides very good performance with respect to signal transmission even at high frequencies. However, as the roughness decreases the adhesion of the copper foil to the resin layer used in laminated structures of circuit boards also decreases, often leading to unwanted delamination. To counter poor adhesion and possible delamination, the copper foils are intentionally roughened on the side to be contacted with the resin. The roughened surface, using standard methods, can provide a surface roughness typically on the order of microns and will impact any transmission in the GHz range. The design is therefore constrained by the conflicting need for high roughness to ensure enough adhesion, and low roughness to minimize transmission loss.

Although VLP copper foils provide an improvement with regards to transmission loss, improvements are needed in these copper foils when roughened, to maintain the advantages to transmission loss while improving adhesion characteristics. There therefore remains a need for copper foils with low transmission loss and good adhesion strength for the manufacturing of circuit boards.

SUMMARY

In general, the disclosure herein relates to a copper foil such as an electrodeposited copper foil that can be used as a conductor in a circuit board. Copper foils have been prepared having controlled surface properties that provide for low transmission loss even at high frequencies and high adhesion to the resin layer in the circuit board.

In a first aspect, the disclosure comprises a surface-treated copper foil. The surface-treated copper foil comprises an electrodeposited copper foil and a treatment layer. The electrodeposited copper foil includes a drum side and a deposited side. The treatment layer is disposed on one of the drum side and the deposited side, and provides a surface-treated side. Wherein the treatment layer comprises a nodule layer and wherein the surface-treated side exhibits a void volume (Vv) in a range of 0.1 to 0.9 µm$^3$/µm$^2$, and wherein a combined hydrogen and oxygen content of the surface-treated copper foil is less than or equal to 300 ppm.

Optionally, the combined oxygen and hydrogen content of the surface-treated copper foil is at least 50 ppm. Optionally, the void volume (Vv) is less than or equal to 0.7 µm$^3$/µm$^2$. Optionally, the nodule layer comprises copper nodules.

Optionally, according to the first aspect of the disclosure, the surface treated side further exhibits a core void volume (Vvc) in a range of 0.08 to 0.84 µm$^3$/µm$^2$. Optionally, the surface treated side further exhibits a dale void volume (Vvv) in a range of 0.01 to 0.07 µm$^3$/µm$^2$.

Optionally, according to the first aspect of the disclosure, the treatment layer further comprises a barrier layer including nickel, and a nickel areal density of the treatment layer is in a range of 40 to 200 µg/dm$^2$. Optionally, the nickel areal density is less than or equal to 120 µg/dm$^2$. Optionally, the treatment layer further comprises a barrier layer including nickel, and the void volume (Vv) is less than or equal to 0.7 µm$^3$/µm$^2$.

Also optionally, according to the first aspect of the disclosure, the treatment layer is on the deposited side. Optionally, the treatment layer is on the drum side. Optionally, the treatment layer is a first treatment layer, and the surface-treated copper foil further comprises a second treatment layer disposed on one of the drum side and the deposited side, where the first treatment layer and second treatment layer are not disposed on the same side of the electrodeposited copper foil. Optionally, the treatment layer is a first treatment layer, and the surface-treated copper foil further comprises a second treatment layer disposed on the other one of the drum side and the deposited side. Optionally, the second treatment layer does not comprise a nodule layer.

Optionally, the treatment layer according to the first aspect of the disclosure further comprises at least one of a cover layer, a barrier layer, an anti-tarnish layer, and a coupling layer. Optionally, the cover layer comprises copper. Optionally, the barrier layer comprises one or more sub-layers wherein each sub-layer independently comprises a metal or an alloy containing the metal, and the metal is selected from at least one of Ni, Zn, Cr, Co, Mo, Fe, Sn, and V. Optionally, the anti-tarnish layer comprises chromium. Optionally, the coupling layer includes silicon.

In a second aspect, the disclosure comprises a laminate. The laminate comprises a surface-treated copper foil and a resin layer in contact with a surface-treated side of the surface-treated copper foil. The surface-treated copper foil comprises an electrodeposited copper foil including a drum side and a deposited side, a treatment layer disposed on one of the drum side or the deposited side, and the treatment layer providing the surface-treated side, wherein the treatment layer comprises a nodule layer, and wherein the surface-treated side exhibits a void volume (Vv) in a range of 0.1 to 0.9 µm$^3$/µm$^2$. The combined hydrogen and oxygen content of the surface-treated copper foil is less than or equal to 300 ppm, and the surface-treated copper foil has a nickel areal density in a range of 40 to 200 µg/dm².

In a third aspect, the disclosure comprises a device. The device comprises a circuit board comprising the surface-treated copper foil according to the first aspect of the disclosure and a plurality of components mounted on the circuit board. At least a first component and a second component of the plurality of components are electrically connected to each other through the surface-treated copper foil of the circuit board.

The surface-treated copper foils as described herein show excellent properties, for example when used as a component in a circuit board. These can have low transmission loss of electrical signals even at high frequencies, and having good adhesion characteristics to resins.

The above summary is not intended to represent every embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings.

Figure 1A:
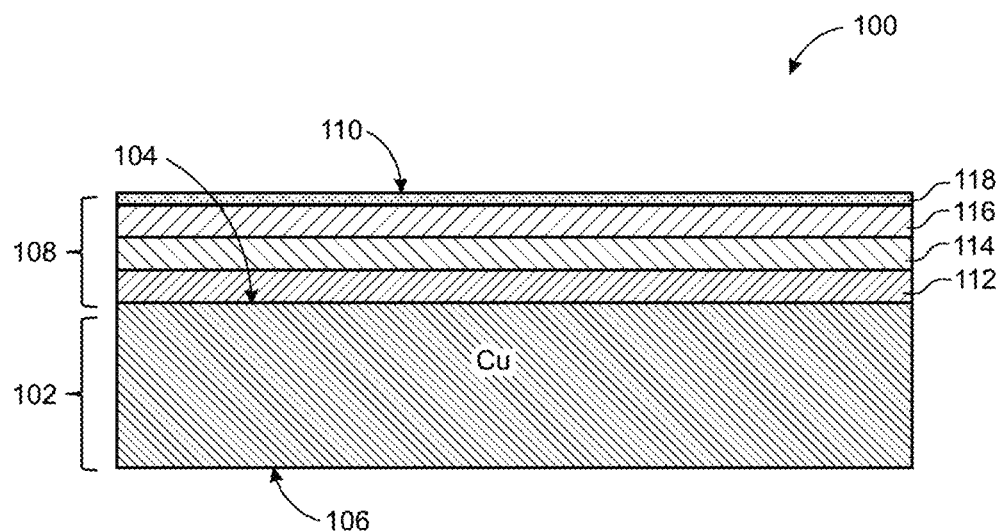
FIG. 1A shows a surface-treated copper foil according to a first embodiment.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

It should be expressly understood that all the graphics and other representations of the drawings are schematic only. The same numbers are used to represent similar elements in various figures of the drawings to facilitate understanding of the disclosed embodiments.

DETAILED DESCRIPTION

Surface-treated copper foils are described that exhibit low transmission loss. The surface-treated copper foils have controlled surface characteristics such as void volumes and controlled compositions such as the concentrations of hydrogen and oxygen. Such surface-treated copper foil can be useful for the production of articles needing low transmission loss of electrical signals, such as printed circuit boards, as current collectors in secondary batteries or any thin copper foil covering an insulator.

Figure 1B:
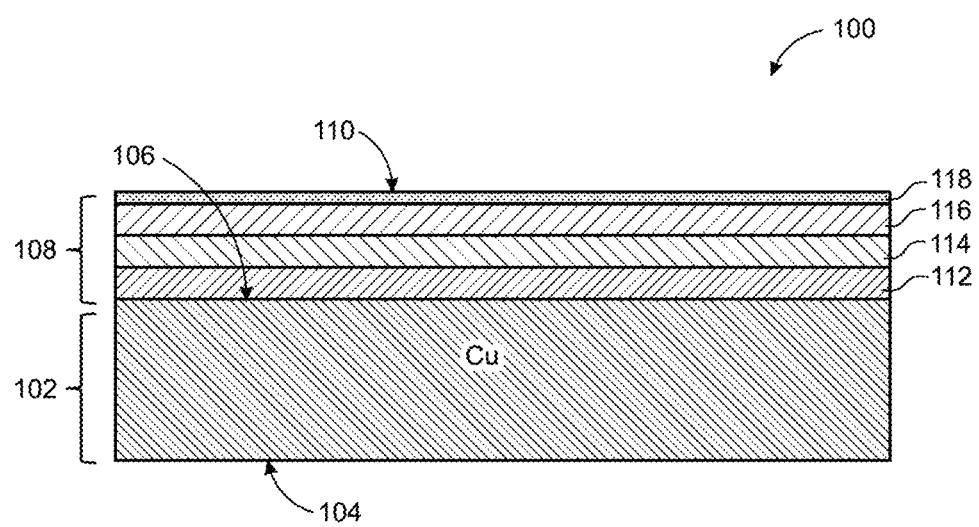
FIG. 1B shows a surface-treated copper foil according to a second embodiment.

FIG. 1A shows a first embodiment and FIG. 1B shows a second embodiment of a surface treated copper foil 100 as schematic cross-sectional views. FIG. 1A shows an electrodeposited copper foil 102 and a treatment layer 108. The electrodeposited copper foil 102 has a drum side 104 and a deposited side 106. The treatment layer 108 is disposed on the drum side 104 and provides a surface-treated side 110. FIG. 1B shows a second embodiment, where the treatment layer 108 is disposed on the deposited side 106 and provides a surface-treated side 110.

Figure 1C:
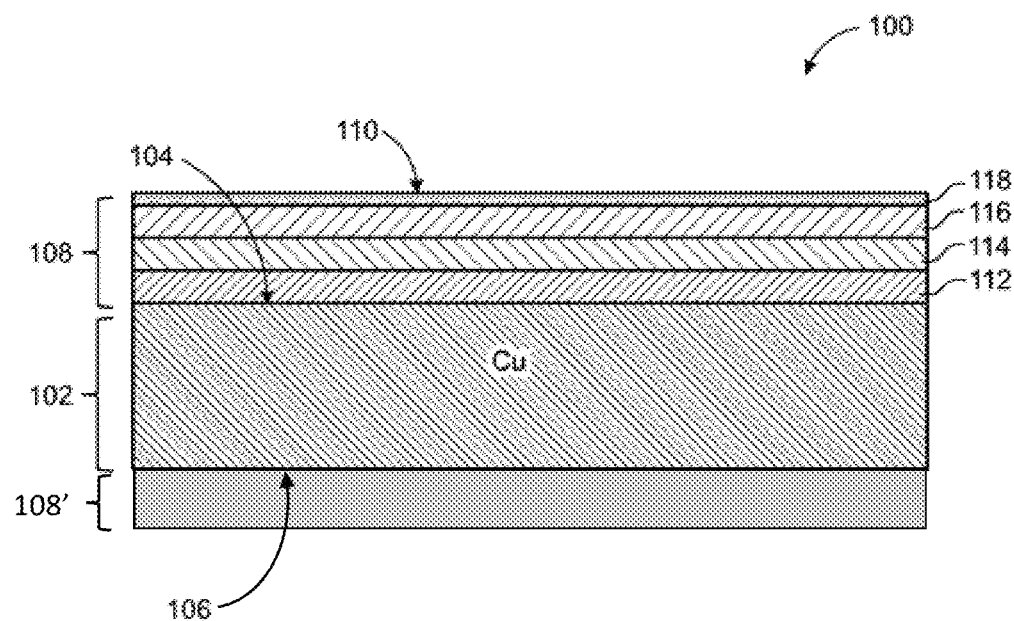
FIG. 1C shows a surface-treated copper foil according to a third embodiment.
Figure 1D:
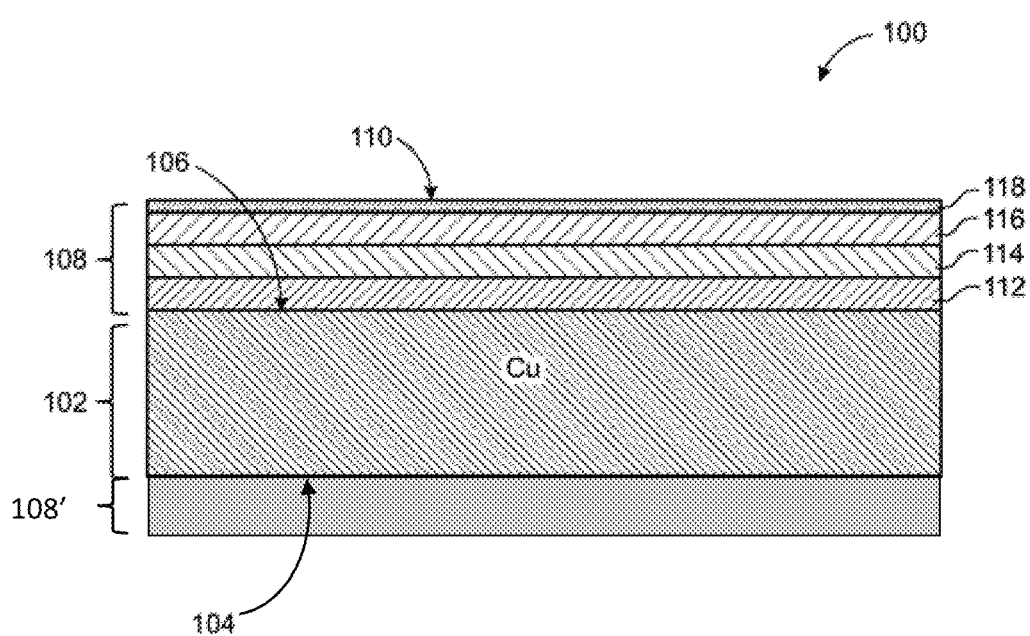
FIG. 1D shows a surface-treated copper foil according to a fourth embodiment.

FIG. 1C and FIG. 1D show two other embodiments of surface treated copper foils 100. In a third embodiment, as shown by FIG. 1C, the treatment layer 108 is defined as first treatment layer, and a second treatment layer 108' is disposed on the deposited side 106. In a fourth embodiment, as shown by FIG. 1D, the treatment layer 108 is defined as a first treatment layer, and a second treatment layer 108' is disposed on the drum side 104.

As used herein the "drum side" of the copper foil is the surface of the copper foil that is in contact with a drum used during the electrodeposition, while the "deposited side" is the opposite side, or the surface of the electrodeposited copper foil that is in contact with an electrolyte solution during the electrodeposition forming the copper foil. These terms relate to a manufacturing process for producing electrodeposited copper foils which include partially immersing a rotating drum assembly into an electrolyte solution containing copper ions, and optionally other additives such as rare earth metals and surfactants. Therefore, under operation of an electric current, copper ions are drawn to the drum and reduced, resulting in copper metal plating onto the surface of the drum forming an electrodeposited copper foil on the surface of the drum. This electrodeposited copper foil is formed and removed from the drum in a continuous process by rotating the drum and removing the electrodeposited copper foil as the formed copper foil rotates with the drum out of the electrolyte solution. For example, the electrodeposited copper foil can be pulled off the drum as it is formed by, and passed over or through rollers in a continuous process.

As illustrated by FIGS. 1A-1D, the surface treatment providing treatment layer 108 can include one or more treatments such as a roughening treatment to provide a nodule layer 112, a passivation treatment to provide a barrier layer 114, an anti-tarnishing treatment to provide an anti-tarnish layer 116, and a coupling treatment to provide a coupling layer 118. Therefore, in the embodiments shown by FIGS. 1A-1D, the nodule layer 112, barrier layer 114, anti-tarnish layer 116, and coupling layer 118 are sub-layers of the treatment layer 108. The surface treatment and specific sub layers of treatment layer 108 shown in the figures are optional embodiments, and other surface treatments and other sub-layers in addition to or as alternatives thereof can be used in some other embodiments. Accordingly, one or more than one of the sub-layers may be present in the different embodiments of the treatment layer 108.

As illustrated in FIGS. 1C and 1D, the second treatment layer 108' can be applied in some embodiments. In some embodiments the second treatment layer 108' can be the same as the first treatment layer 108. For example, the second treatment layer 108' can include a nodule layer, a barrier layer, and anti-tarnish layer, and coupling layer, where these are not shown in the figures. In some embodiments the second treatment layer 108' does not include a nodule layer. In some embodiments the second treatment layer 108' includes a barrier and an anti-tarnish layer. In some embodiments the second treatment layer 108' is an anti-tarnish layer.

Figure 2:
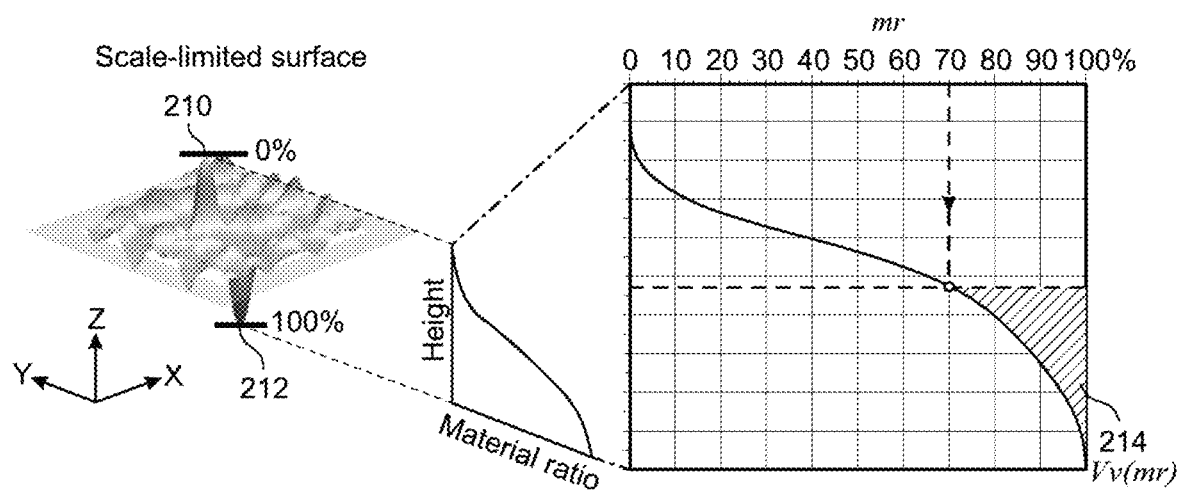
FIG. 2 shows a 3D surface plot and an areal material ratio plot.

The surface-treated copper foil has surface texture or features that affect its properties and final performance when incorporated into manufactured products such as a circuit board or a battery. One such feature is the void volume parameters, which are described with reference to FIG. 2, showing a 3D surface, such as a surface treated side of an electrodeposited copper foil, and the derivation of the areal material plot for obtaining void volume parameters. FIG. 2, left side, is a three-dimensional graphic representation of the surface geometry of the surface. FIG. 2, right side shows the derivation of an areal material ratio curve as can be obtained by using the ISO Standard Method ISO 25178-2:2012, which spans a material ratio (mr) of 0%, at the top of the highest peak 210, to the lowest valley or hole 212 at which the mr is 100%. The void volume (Vv) is calculated by integrating the volume of the voids enclosed above the surface and below a horizontal cutting plane set at a height corresponding to a specified material ratio (mr) between 0% (the top of the peak 210) and 100% (the bottom of the hole 212). For example, the Vv at 70% mr is shown as the shaded area 214 on the right side plot of FIG. 1. As used herein, the Vv's listed are the Vv at 10% mr unless otherwise noted.

Figure 3:
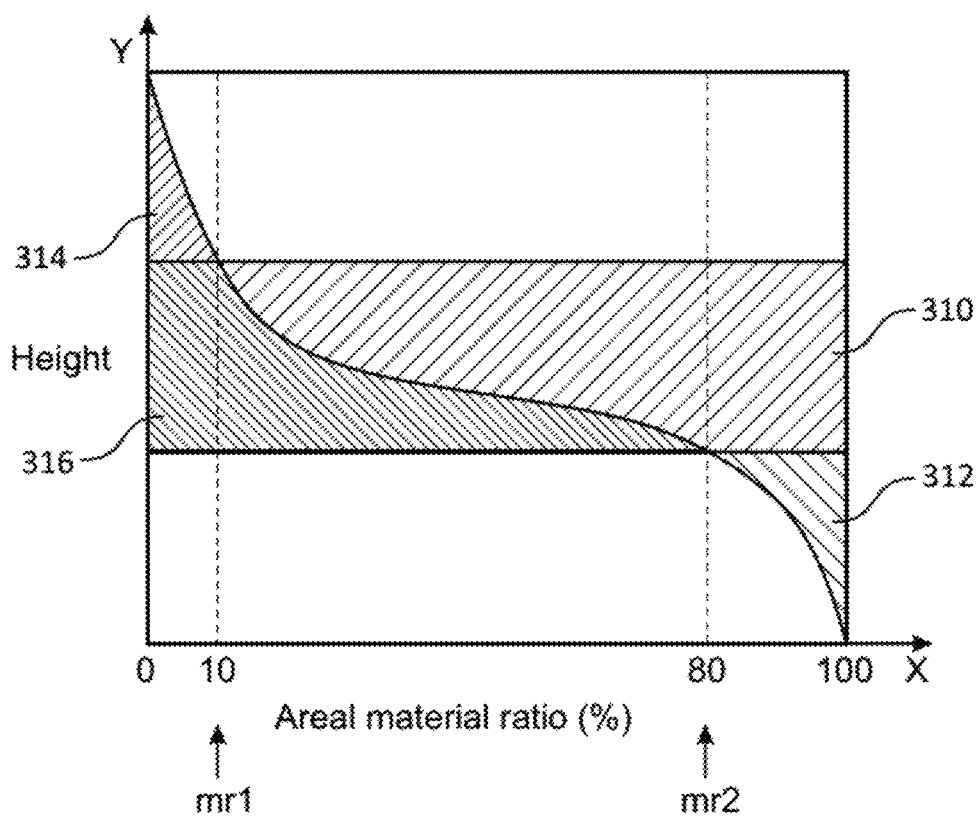
FIG. 3 shows details of an areal material ratio plot.

FIG. 3 shows more details of an areal material ratio plot with some relationships regarding different kinds of void volume parameters defined. The core void volume (Vvc) is the difference in void volume between two material ratios, such as mr1 and mr2, shown as area 310. As used herein, unless otherwise specified, Vvc is chosen to be where mr1 is 10% and mr2 is 80%. The dale void volume (Vvv), which is also called the valley void volume, is the void volume at a specified mr value, such as mr at 80%, shown as area 312. As used herein, unless otherwise specified, Vvv is calculated at a material ratio of 80%. The void volume (Vv) at mr1 is the sum of the core void volume (Vvc) between mr1 and mr2, area 310, and the dale void volume (Vvv), area 312, at mr2.

In some embodiments, the surface treated side 110 has a void volume (Vv), in a controlled range between a low and a high value, such as between a low value of about 0.1 $\mu m^3/\mu m^2$ and a high value of about 0.9 $\mu m^3/\mu m^2$. It is expressly understood that these ranges are continuous. Accordingly, the value can be: 0.10, 0.11, 0.12, 0.13, 0.14, 0.15, 0.16, 0.17, 0.18, 0.19, 0.20, 0.21, 0.22, 0.23, 0.24, 0.25, 0.26, 0.27. 0.28, 0.29, 0.30, 0.31, 0.32, 0.33, 0.34, 0.35, 0.36, 0.37. 0.38, 0.39, 0.40, 0.41, 0.42, 0.43, 0.44, 0.45, 0.46, 0.47, 0.48, 0.49, 0.50, 0.51, 0.52, 0.53, 0.54, 0.55, 0.56, 0.57. 0.58, 0.59, 0.60, 0.61, 0.62, 0.63, 0.64, 0.65, 0.66, 0.67, 0.68, 0.69, 0.70, 0.71, 0.72, 0.73, 0.74, 0.75, 0.76, 0.77, 0.78, 0.79, 0.80, 0.81, 0.82, 0.83, 0.84, 0.85, 0.86, 0.87, 0.88, 0.89, or 0.90 $\mu m^3/\mu m^2$, with each of these values representing a possible endpoint in a range of values.

Without being bound to a specific mechanism, it is suggested that when Vv is too low, such as less than about 0.1 $\mu m^3/\mu m^2$, the adhesion of the copper foil to a resin can be poor. That is, the material cannot anchor to the surface very well so adhesion is poor. Conversely, if Vv is too high, such as above about 0.9 $\mu m^3/\mu m^2$, the transmission loss is too high in magnitude.

In some embodiments, the surface treated side 110 has a core void volume (Vvc), in a controlled range between a low and a high value, such as between a low value of about 0.08 $\mu m^3/\mu m^2$ and a high value of about 0.84 $\mu m^3/\mu m^2$. It is expressly understood that these ranges are continuous and can be represented by any value in this range. In some embodiments Vvc has a low value of at least 0.08, 0.089, 0.09, 0.097, 0.10, 0.15, 0.197, 0.2, 0.225, 0.25, 0.30, 0.326, 0.35, 0.361, 0.384, 0.40, 0.45, 0.50, 0.503, 0.55, 0.591, 0.60, 0.602, 0.65, 0.671, 0.681, 0.683, 0.70, 0.75, 0.80, 0.831, or 0.84 $\mu m^3/\mu m^2$. In some embodiments Vvc has a high value of not more than 0.84, 0.831, 0.80, 0.75, 0.70, 0.683, 0.681, 0.671, 0.65, 0.602, 0.60, 0.591, 0.55, 0.503, 0.50, 0.45, 0.40, 0.384, 0.361, 0.35, 0.326, 0.30, 0.25, 0.225, 0.2, 0.197, 0.15, 0.10, 0.097, 0.09, 0.089, or 0.08 $\mu m^3/\mu m^2$.

In some embodiments, the surface treated side 110 has a dale void volume (Vvv), in a controlled range between a low and a high value, such as between a low value of about 0.01 $\mu m^3/\mu m^2$ and a high value of about 0.07 $\mu m^3/\mu m^2$. It is expressly understood that these ranges are continuous and can be represented by any value in this range. In some embodiments Vvv has a low value of at least 0.010, 0.013, 0.015, 0.020, 0.022, 0.025, 0.026, 0.027, 0.030, 0.034, 0.035, 0.036, 0.040, 0.044, 0.045, 0.047, 0.048, 0.050, 0.051, 0.055, 0.057, 0.060, 0.065, 0.068, or 0.070 $\mu m^3/\mu m^2$. In some embodiments Vvv has a high value of not more than 0.070, 0.068, 0.065, 0.060, 0.057, 0.055, 0.051, 0.050, 0.048, 0.047, 0.045, 0.044, 0.040, 0.036, 0.035, 0.034, 0.030, 0.027, 0.026, 0.025, 0.022, 0.020, 0.015, 0.013, or 0.010 $\mu m^3/\mu m^2$.

The surface-treated copper foil has compositional properties or features that affect its properties and final performance when incorporated into manufactured products such as a circuit board or a battery. For example, trace amounts of compounds identified as oxygen and hydrogen by elemental analysis. Without limitation, the oxygen and hydrogen can be located throughout the surface-treated copper foil, such as in the bulk of the copper foil 102 and also in treatment layers 108 and 108'.

In some embodiments, the surface-treated copper foil has a combined oxygen and hydrogen content in a controlled range between a low and a high value, such as a low value of 0 ppm and a high value of up to 300 ppm. It is expressly understood that these ranges are continuous and can be represented by any value in this range. In some embodiments the combined oxygen and hydrogen content has a low value of at least 0, 10, 20, 30, 40, 43, 45, 47, 50, 52, 60, 70, 80, 90, 100, 110, 113, 116, 120, 129, 130, 131, 135, 140, 150, 160, 170, 178, 180, 189, 190, 200, 207, 210, 220, 230, 234, 240, 250, 260, 270, 280, 290, or 300 ppm. In some embodiments the combined oxygen and hydrogen content has a high value of not more than 300, 290, 280, 270, 260, 250, 240, 234, 230, 220, 210, 207, 200, 190, 189, 180, 178, 170, 160, 150, 140, 135, 131, 129, 120, 113, 113, 110, 100, 90, 80, 70, 60, 52, 50, 47, 54, 43, 40, 30, 20, 10 or 0 ppm.

Without being bound to a specific mechanism, it is suggested that when the combined hydrogen and oxygen content are too high, these substances can increase the impedance of the electrodeposited copper foil, therefore impacting the electrical properties such as transmission. Where the combined hydrogen and oxygen content generally should be minimized, it has been found that in some embodiments having some combined hydrogen and oxygen, such as more than 50 ppm, can improved properties such as allowing the formation of a surface-treated copper foil with lower Vv and concomitantly lower transmission loss.

In some embodiments the nodule layer, such as nodule layer 112, can include metal nodules such as copper nodules. The nodules can be formed, for example, by electroplating the metal onto the electrodeposited copper foil. In some embodiments, the copper nodules can be made of copper or copper alloy. In some embodiments the nodule layer includes a metal cover layer on the metal nodules, such as a copper deposition on copper nodules. For example, the metal cover layer can help to prevent exfoliation of the metal nodules.

As used herein the "barrier layer" is a layer made of a metal or an alloy containing the metal. In some embodiments the barrier layer, such as barrier layer 114, is made of at least one metal selected from zinc (Zn), chromium (Cr), nickel (Ni), cobalt (Co), molybdenum (Mo), vanadium (V), iron (Fe), tin (Sn), and combinations thereof. In some embodiments the barrier layer comprises Ni. In some embodiments the barrier layer comprises Zn. In some embodiments the barrier layer comprises a Ni layer and a Zn layer.

As used herein an "anti-tarnish layer," such as anti-tarnish layer 116, is a coating applied to a metal that can protect the coated metal from degradation such as due to corrosion. In some embodiments, the anti-tarnish layer comprises a metal or an organic compound. For example, chromium or chromium alloys can be used as a metal coating on the electrodeposited copper foil. When the anti-tarnish layer is made of chromium alloy, it further contains any one or more of zinc (Zn), nickel (Ni), cobalt (Co), molybdenum (Mo), and vanadium (V). In some embodiments where the anti-tarnish layer is made of organics, the layer may comprise at least one member selected from the group consisting of triazoles, thiazoles, and imidazoles, or their derivatives. The triazole group includes but is not limited to orthotriazole (1,2,3-triazole), benzotriazole, tolyltriazole, carboxybenzotriazole, chlorine substituted benzotriazole, 3-amino-1,2,4-triazole, 2-amino-1,3,4-triazole, 4-amino-1,2,4-triazole, 1-amino-1,3,4-triazole, and isomers thereof, or derivatives thereof. The thiazole group includes but not limites to thiazole, 2-mercaptobenzothiazole, dibenzothiazyldisulfide, and isomers thereof, or derivatives thereof. The imidazole group includes but not limites to imidazole, 2-methylimidazole, 2-ethyl-4-methylimidazole, 2-phenylimidazole, 1-benzyl-2-methylimidazole, and isomers thereof, or derivatives thereof.

As used herein the "coupling layer," such as coupling layer 118, is a sub-layer that is added to improve the binding between the copper foil and a resin layer, for example a resin layer used in the manufacture of circuit boards. In some embodiments this is provided by a silane treatment which provides a sub-layer including silicon and oxygen. The silane can be exemplified but not limited to amino-based silane, epoxy-based silane, and mercapto-based silane. The silane may be selected from vinyltrimethoxysilane, vinyltriethoxysilane, 2-(3,4-epoxycyclohexyl)ethyltrimethoxysilane, 3-glycidoxypropyl methyl dimethoxysilane, 3-glycidoxypropyl trimethoxysilane, 3-glycidoxypropyl methyldiethoxysilane, 3-glycidoxypropyl triethoxysilane, p-styryltrimethoxysilane, 3-methacryloxypropyl methyldimethoxysilane, 3-methacryloxypropyltrimethoxysilane, 3-methacryloxypropylmethyldiethoxysilane, 3-methacryloxypropyl triethoxysilane, 3-acryloxypropyl trimethoxysilane, N-2-(aminoethyl)-3-aminopropylmethyldimethoxysilane, N-2-(aminoethyl)-3-aminopropyltrimethoxysilane, 3-aminopropyltrimethoxy silane, 3-aminopropyltriethoxy silane, partially hydrolyzates of 3-triethoxysilyl-N-(1,3-dimethylbutylidene)propylamine, N-(vinylbenzyl)-2-aminoethyl-3-aminopropyltrimethoxysilane hydrochloride, N-phenyl-3-aminopropyltrimethoxysilane, N-(vinylbenzyl)-2-aminoethyl-3-aminopropyltrimethoxysilane hydrochloride, tris-(trimethoxysilylpropyl)isocyanurate, 3-ureidopropyltrialkoxysilane, 3-mercaptopropylmethyldimethoxysilane, 3-mercaptopropyltrimethoxysilane, and 3-isocyanatepropyltriethoxysilane, but not limited thereof.

In some embodiments the sub-layers, such as the sub-layers of treatment layer 108, are provided so that the drum side 104 (FIG. 1A and FIG. 1C) or the deposited side 106 (FIG. 1B and FIG. 1D) of the electrodeposited copper foil is covered with nodule layer 112, the nodule layer 112 is covered with the barrier layer 114, the barrier layer 114 is covered with the anti-tarnish layer 116, and the anti-tarnish layer 116 is covered with the coupling layer 118; however, according to other embodiments, the stacking order or number of the sub-layers is not limited therein. In the embodiments shown by FIGS. 1A-1D, the final physical surface of the surface treated side 110 is therefore provided by the coupling layer 118 which can then be coupled to a resin layer in a laminate structure. In some embodiments, the surface properties of the surface-treated side 110, such as the void volume parameters Vv, Vvv and Vvc are dominated by the nodule layer 112, since barrier layer 114, anti-tarnish layer 116, and coupling layer 118 in any combination can be much thinner than the nodule layer 112.

In some embodiments, the combination or the stacked order of sub-layers in the second treatment layer 108' are different from those in the first treatment layer 108. In some embodiments, for example with reference to FIG. 1C, a zinc layer can be deposited on the deposited side of 106 and then a chromium layer can be deposited on the zinc layer, the zinc and chromium layer forming the second treatment layer 108'. In some other embodiments, for example with reference to FIG. 1D, a zinc layer can be deposited on the drum side 104 and then a chromium layer can be deposited on the zinc layer, the zinc and chromium layer forming the second treatment layer 108'.

It is expressly understood that even where individual sub layers in the first treatment layer 108 and the second treatment layer 108' can be the same layer such as a barrier zinc layer, the physical characteristics of these layers, such as the thickness, can be different. It is also expressly understood that where individual sub layers in the first treatment layer 108 and the second treatment layer 108' both serve a similar function, they can be compositionally different. For example, where both the first treatment layer 108 and the second treatment layer 108' include an anti-corrosion layer, one treatment layer such as the first treatment layer 108 optionally can include a metal and the other such as the second treatment layer 108' can include an organic compound.

The surface-treated electrodeposited copper foil has compositions or features that affect its properties and final performance when incorporated into manufactured products such as a circuit board or a batter. For example, in some embodiments the areal density of deposited metals, such as in first treatment layers 108 and second treatment layers 108', are controlled between a low and high value.

An "areal density" or "area density" of a two-dimensional object is the mass per unit area. As used herein "a nickel areal density" refers to the mass per unit area of nickel in a treatment layer, such as 108, of a surface-treated copper foil.

In some embodiments, the surface treated copper foil 100 has a nickel areal density in a controlled range between a low and a high value, such as between a low value of about 40 $\mu g/dm^2$ and a high value of about 200 $\mu g/dm^2$. It is expressly understood that these ranges are continuous. Accordingly, the low value can equal to or greater than 40, 42, 43, 44, 45, 48, 50, 53, 57, 60, 61, 63, 70, 80, 90, 100, 103, 110, 120, 130, 140, 150, 155, 158, 160, 170, 176, 180, 190, 197, or 200 $\mu g/dm^2$. The high value can be equal to or less than 200, 197, 190, 180, 176, 170, 160, 158, 155, 150, 140, 130, 120, 110, 103, 100, 90, 80, 70, 63, 61, 60, 57, 53, 50, 48, 45, 44, 43, 42 or 40 µg/dm².

In some embodiments, the surface-treated copper foil 100 and a resin layer are combined to form a laminated structure. The structure can include two or more layers of alternating copper foil and resin layer. These can be formed, for example, by stacking alternate sheets of the copper foil, at least one being a surface-treated copper foils 100, and a resin layer, and compressing the stack together using a press while heating the stack. In some embodiments, the resin layer is contacted with the surface-treated side 110 of the surface-treated copper foil 100. Where more than three conductive layers, e.g., at least one being a surface-treated copper foil 100, are alternated with resin layers, the laminate is a multilayer structure such as can be used to make a multilayer PCB (printed circuit board).

As used herein a "resin" relates to an organic polymeric material that can be formed as a sheet or layer on a substrate such as a surface-treated copper foil. Some examples of a resin include phenolic resins, epoxy resins, polyester resins (e.g., polyethylene terephthalates), polyimide resins, acrylics, formaldehyde resins, bismaleimide triazine resins, cyanate ester resin, fluoropolymers, poly ether sulphone, cellulosic thermoplastics, polycarbonate, polyolefins, polypropylene, polysulfide and polyurethane. The resins can also include filler materials or reinforcing materials such as aramide, carbon, glass, cellulosic and inorganic materials, all of these optionally in the form of particles, fibers, chopped fibers, woven materials or a webbing. In some embodiments the resin is formed into a sheet using one or more of the resins and one or more of the filler materials in a composite sheet. In some embodiments one or more resin layers are stacked on top of each other and in direct contact to provide a multi-stack resin layer sometimes referred to a multiple board. As used herein a resin layer can refer to a multi-stack resin layer such as a multiple board.

In some embodiments the surface-treated copper foil 100 is used to produce a circuit board (e.g., a printed circuit board or PCB). For example, a circuit board formed using a laminate of the copper foil and a resin layer. Further processing such as the production of conducting lines or tracks, contact pads, shielding areas, and conduction vias can be achieved by known processing methods such as lithography, copper etching, and drilling of the copper foil/resin laminate. Components, such as batteries, resistors, LEDs, relays, transistors, capacitors, inductors, diodes, switches, microcontrollers, crystals and oscillators, and integrated circuit can be mounted (e.g., mechanically and electrically connected) to the circuit board by known methods. For example, surface mount methods or the through-hole methods to attach the components, and pick and place technologies for assembly.

In some embodiments the surface-treated copper foil 100 can be used for making a circuit board, including a plurality of components mounted on the circuit board, that is used in a device. As used herein a device comprises any item or component for processing an electric signal such as by manipulation of the voltage, current, frequency or power of the signal. For example, and without limitation, a computer such as used in a laptop, desktop, vehicles, phones, measurement and monitoring devices (e.g., glucose meter, pH meter, air monitoring device), data output devices (e.g., monitors, printers), input devices (touch screens, keyboards, mouse), and wireless transmission/receiving devices such as Wi-Fi, Zigbee and Bluetooth and radar.

In some embodiments, the surface-treated copper foil 100 can be used as a current collector. In some embodiments the surface-treated copper foil can be used as a current collector in a lithium ion secondary battery. For example, in a laminated type lithium ion battery or coin type lithium ion battery. It is expressly understood that for these embodiments some modifications in can be made, such as where sub-layers without a silane coupling layer or a barrier layer can be used. Accordingly, in some embodiments, the surface-treated copper foil 100 does not include a barrier layer 114 or a coupling layer 118.

It should be understood within the scope of the present disclosure, the above-mentioned technical features and technical features mentioned below (such as examples) can be combined freely and mutually to form new or preferred technical solutions, which are omitted for brevity.

EXAMPLES

Surface-Treated Copper Foil Preparation
Electrodeposited Copper Foil Preparation.

An electrolyte was made by dissolving copper wire in an aqueous solution of sulfuric acid (50 wt %) affording a copper sulfate electrolyte solution which contained 280 g/L of copper sulfate ($CuSO_4.5H_2O$). The copper sulfate electrolyte solution also contained 20-80 g/L of sulfuric acid, and 5-35 mg/L of chloride ion (from hydrochloric acid, RCI Labscan Ltd), the specific amounts are indicated in the Table. To every liter of the copper sulfate electrolyte 3.23 mg of Chitosan (Chitosan, MW=5000, manufactured by Aldrich), and 1.83 mg of 3,3'-Thiobis-1-propanesulfonic acid, disodium salt (TBPS, manufactured by Aldrich) were also added.

Bulk copper foils were prepared by electrodeposition on a rotating drum, where the drum is partially immersed in the electrolyte solution described above. The drum acts as a cathode to a counter anode electrode which causes copper ions in the electrolyte to deposit on the drum in a continuous fashion. The drums were chosen to have grain size numbers on their surface, where the deposition occurs, in a range of 5-11. The specific grain size numbers are indicated in the Table. Copper foils having a thickness of about 18 µm were prepared using a current density of 48 A/dm² and controlling the electrolyte solution temperature at about 43° C.

Surface Treatment.

In a first step for the roughening treatment, after preparing the electrodeposited copper foil as outlined above, the electrodeposited copper foil is cleaned by using an acid solution. An acid washing vessel was used for this procedure where the vessel was filled with an electrolyte containing 130 g/L copper sulfate and 50 g/L sulfuric acid and a temperature of about 27° C. was maintained for the solution. The electrodeposited copper foil was directed into the acid washing vessel where it was soaked into the electrolyte for 30 seconds to remove any oil, fat and oxide present on the surface. The electrodeposited copper foil was then rinsed with water.

A nodule layer was then formed by electroplating on the surface of the drum side or the deposited side of the electrodeposited copper foil, as indicated in the Table. For plating the nodule layer, a copper sulfate solution was used as the plating electrolyte which contained 70 g/L of copper sulfate and 100 g/L of sulfuric acid. The temperature of the copper sulfate solution was maintained at about 25° C., and the electrodeposited copper foil was electroplated for 10 seconds at a current density in a range of 24-48 A/dm², the specific values of which are listed in the Table as the roughing treatment (RT). This roughening treatment provides a nodule layer on either the drum side or the deposited side. The side opposite to the nodule layer is defined as a resist side.

To prevent exfoliation of the nodule layer, a copper cover layer, forming a nodule layer cover, was deposited onto the nodule layer by electrodeposition. In the covering process, to prepare the nodule layer cover, a copper sulfate solution was used in which the concentration of copper sulfate was 320 g/L and the concentration of sulfuric acid was and 100 g/L. The temperature of electrolyte solution was maintained at about 40° C. The current density during this electrodeposition step was selected to be in a range of 6-12 A/dm$^2$, as listed in the Table (cover treatment or CT), for 10 seconds.

After completing the nodule layer cover plating process, two barrier layers were applied. Firstly, nickel was deposited on the surface of nodule layer. This serves to passivate the nodule layer. The electrolysis was performed in an electrolyte solution comprising nickel sulfate 188 g/L, boric acid 32 g/L, hypophosphorous acid 5 g/L, and a pH in a range of about 3.2 to about 3.8. During electrolysis, the temperature was maintained at 20° C. and the current density was set in a range of 0.4 to 0.8 A/dm' for 3 seconds, where the specific current density values are listed in the Table.

Secondly, after a water wash, a zinc containing layer was deposited on the nickel layer and the opposite side of the electrodeposited copper foil simultaneously. The zinc containing layer was provided by a solution containing 11 g/L zinc sulfate and having a pH of about 13.0. The solution was maintained at a temperature of 15° C. during electrodeposition. The current density during the zinc layer deposition was set to 0.6 A/dm' for 3 seconds.

After formation of the barrier layers, washing was conducted with water and a chromium anti-tarnish layer was formed on the zinc layer by electroplating in a plating bath. A plating bath containing 5 g/L of chromic acid, pH about 12.5, was maintained at a temperature of 17° C. during the plating. The plating was conducted with a current density of 1.0 A/dm' for 3 seconds to form the chromium layer.

Finally, a coupling layer was formed on the anti-tarnish layer on the side having the nodule layer of the electrodeposited copper foil. A silane solution is sprayed on the anti-tarnish layer (nodule layer side) for 3 seconds. The silane solution was a water solution containing 0.25 wt % of 3-Aminopropyltriethoxysilane.

After silane treatment the foil is heated at 120° C. for a one-minute residence time in an oven and then wound into a roll.

Copper Foil Characterization

Copper foils made as described above and with specific conditions are indicated in the Table. Twenty-three experiments are listed. The data listed exemplifies some embodiments of the surface treated copper foil. Good characteristics for the surface-treated copper foil are a high peel strength, such as greater than or equal to 0.40 N/mm, and low magnitude (low absolute value) of transmission loss, such as having a measured transmission loss of greater than about −23 dB/m.

Examples 1-11 all exhibit a Vv in a range of 0.1 to 0.9, and have a combined hydrogen and oxygen content less than 300 ppm. These examples also show good characteristics as defined above, where the peel strength is at least 0.40 N/mm, and the measured transmission loss is greater than −23 dB/m. It is also noted that the nodule layer is formed on the deposited side for examples 1-7 and 11, and the nodule layer is formed on the drum side in Examples 8-10. Therefore, copper foils with good characteristics can be formed where the nodule layer is formed on either the deposited or the drum side.

Where the Vv is high, above 0.9 μm$^3$/μm$^2$, such as in examples 13, 19, and 21-23, the magnitude of transmission loss is also high, with measured values ranging from −27.2 dB/m as shown in example 21 to −33.3 dB/m as shown in example 22. This shows that the Vv should be controlled below about 0.9 μm$^3$/μm$^2$. However, where the Vv is too low, as shown by examples 15, 16, and 18, the adhesion becomes too low according to the peel test results. The correlation is clear: example 16, the lowest Vv in the Table at 0.054 μm$^3$/μm$^2$, corresponds to the lowest adhesion at 0.31 N/mm; example 15, the second lowest Vv at 0.070 μm$^3$/μm$^2$, corresponds to the second lowest adhesion at 0.33 N/mm; and example 18, the third lowest Vv value at 0.083 μm$^3$/μm$^2$, corresponds to the third lowest peel strength at 0.35 N/mm.

Where the combined oxygen and hydrogen content is high, above about 300 ppm, the magnitude of transmission loss is found to be too high even when the Vv is in a range between 0.1 and 0.9 μm$^3$/μm$^2$. This is shown by examples 12, 14, 17, and 20, where the combined hydrogen and oxygen contents are 346, 363, 370, and 340 ppm. It is also noted that in example 22, where the Vv is high (0.998 μm$^3$/μm$^2$) and the combined hydrogen and oxygen content is also high (335 ppm) the magnitude of the transmission loss is the highest in the Table, measured at −33.3 dB/m.

In addition to control of Vv and the combined hydrogen and oxygen content, the data in the Table shows that the nickel areal density is also an important characteristic to control in the surface-treated copper foil. Examples 1-10 shows excellent heat resistance when the nickel areal density is in a range of 40 to 200 μg/dm$^2$. Without ascribing to a specific mechanism, it is proposed that having too low nickel areal density does not provide enough oxidation protection to the nodule layer. It is noted that in example 15, the nickel areal density is low, however no discoloration occurs. Again, without limitation to a specific mechanism, it is suggested that since in example 15 the Vv is very low (0.070 μm$^3$/μm$^2$), the nickel might be coating all of the nodule layer uniformly, thereby providing good oxidation protection to the copper. Also it is noted that example 19 shows discoloration but the nickel areal density is 155 μg/dm$^2$ which might be expected to be enough to passivate the copper nodule layer. A proposed theory is that in example 19, the Vv is very high (1.347 μm$^3$/μm$^2$) and therefore even with a high nickel areal density, passivation cannot be achieved as uneven distribution might be present in the coating providing oxygen access to the copper nodule layer through thinner part of the coating.

Where the above shows that the nickel areal density should be controlled to be at least about 40 μm$^3$/μm$^2$, the Table also shows that having too high nickel areal density can also be problematic. This is manifested as an exacerbation of the problems caused by other characteristics already described. For example, high combined hydrogen and oxygen content coupled with a high nickel areal density can lead to even poorer transmission performance, and can be illustrated with reference to examples 12 and 20. Example 12 and example 20 have similar Vv (0.738 and 0.726 μm$^3$/μm$^2$ respectively), similar amounts of combined hydrogen and oxygen content (346 and 340 ppm respectively) but example 12 has an acceptable nickel areal density (48 μg/dm$^2$) while example 20 has a very high nickel areal density at 277 μg/dm$^2$. Although both do not have good transmission characteristics, example 12 at −25.6 dB/m is still better than example 20 at −31.7 dB/m. As another example, the poor transmission performance shown with the surface-treated copper foils having high Vv and high combined hydrogen and oxygen content is exacerbated by having high nickel areal density as well. This is shown by example 20 as compared to example 22. The data for example 20 was discussed above, for comparison example 22 shows Vv at 0.998 μm³/μm², combined hydrogen and oxygen content at 335 ppm and a nickel areal density at 281 μg/dm² and has the highest magnitude of transmission loss, measured at −33.3 dB/m as previously noted.

TABLE

| Ex. | Grain size # of drum | $H_2SO_4$ g/L | Cl ppm | Nodule layer placement | Roughing treatment (RT) A/dm² | Cover treatment (CT) A/dm² | Ratio: $\frac{RT}{CT}$ | Ni plating current density A/dm² |
|---|---|---|---|---|---|---|---|---|
| 1 | 9 | 40 | 15 | Dep. side | 48 | 12 | 4 | 0.4 |
| 2 | 7 | 60 | 15 | Dep. side | 48 | 12 | 4 | 0.4 |
| 3 | 7 | 40 | 25 | Dep. side | 48 | 12 | 4 | 0.4 |
| 4 | 7 | 40 | 15 | Dep. side | 36 | 6 | 6 | 0.4 |
| 5 | 7 | 40 | 15 | Dep. side | 48 | 12 | 4 | 0.6 |
| 6 | 9 | 40 | 15 | Dep. side | 36 | 6 | 6 | 0.6 |
| 7 | 8 | 50 | 20 | Dep. side | 30 | 6 | 5 | 0.5 |
| 8 | 7 | 40 | 15 | Drum side | 48 | 12 | 4 | 0.4 |
| 9 | 9 | 40 | 15 | Drum side | 48 | 12 | 4 | 0.4 |
| 10 | 8 | 50 | 20 | Drum side | 30 | 6 | 5 | 0.5 |
| 11 | 7 | 40 | 15 | Dep. side | 48 | 12 | 4 | 0.2 |
| 12 | 5 | 40 | 15 | Dep. side | 48 | 12 | 4 | 0.4 |
| 13 | 7 | 20 | 15 | Dep. side | 48 | 12 | 4 | 0.4 |
| 14 | 7 | 40 | 5 | Dep. side | 48 | 21 | 4 | 0.4 |
| 15 | 7 | 40 | 15 | Dep. side | 25 | 21 | 2 | 0.4 |
| 16 | 11 | 40 | 15 | Dep. side | 48 | 21 | 4 | 0.4 |
| 17 | 7 | 80 | 15 | Dep. side | 48 | 21 | 4 | 0.4 |
| 18 | 7 | 10 | 35 | Dep. side | 48 | 21 | 4 | 0.4 |
| 19 | 7 | 10 | 15 | Dep. side | 48 | 6 | 8 | 0.4 |
| 20 | 6 | 10 | 10 | Dep. side | 48 | 12 | 4 | 0.8 |
| 21 | 6 | 30 | 20 | Dep. side | 42 | 6 | 7 | 0.4 |
| 22 | 6 | 40 | 10 | Drum side | 48 | 12 | 4 | 0.8 |
| 23 | 6 | 30 | 20 | Drum side | 42 | 6 | 7 | 0.4 |

| Ex. | Vvv μm³/μm² | Vvc μm³/μm² | Vv μm³/μm² | Comb H and O content ppm | Ni areal density μg/dm² | Peel strength N/mm | Heat Test * | Trans. loss dB/m |
|---|---|---|---|---|---|---|---|---|
| 1 | 0.013 | 0.089 | 0.102 | 113 | 42 | 0.4 | ○ | −15 |
| 2 | 0.022 | 0.225 | 0.247 | 300 | 45 | 0.42 | ○ | −16.1 |
| 3 | 0.026 | 0.197 | 0.223 | 20 | 44 | 0.43 | ○ | −17.8 |
| 4 | 0.065 | 0.813 | 0.896 | 234 | 120 | 0.51 | ○ | −20.1 |
| 5 | 0.051 | 0.503 | 0.554 | 189 | 176 | 0.48 | ○ | −21.9 |
| 6 | 0.068 | 0.683 | 0.751 | 135 | 197 | 0.5 | ○ | −22 |
| 7 | 0.034 | 0.361 | 0.395 | 130 | 103 | 0.44 | ○ | −18.7 |
| 8 | 0.048 | 0.602 | 0.65 | 210 | 61 | 0.47 | ○ | −19.6 |
| 9 | 0.027 | 0.412 | 0.439 | 116 | 63 | 0.45 | ○ | −18.4 |
| 10 | 0.047 | 0.384 | 0.559 | 129 | 99 | 0.47 | ○ | −19.9 |
| 11 | 0.036 | 0.326 | 0.362 | 207 | 24 | 0.45 | X | −13.5 |
| 12 | 0.057 | 0.681 | 0.738 | 346 | 48 | 0.49 | ○ | −25.6 |
| 13 | 0.082 | 0.887 | 0.969 | 131 | 45 | 0.54 | ○ | −27.5 |
| 14 | 0.044 | 0.591 | 0.635 | 363 | 53 | 0.48 | ○ | −26.4 |
| 15 | 0.01 | 0.06 | 0.07 | 178 | 22 | 0.33 | ○ | NA |
| 16 | 0.009 | 0.045 | 0.054 | 52 | 43 | 0.31 | ○ | NA |
| 17 | 0.013 | 0.097 | 0.11 | 370 | 57 | 0.41 | ○ | −24.3 |
| 18 | 0.01 | 0.073 | 0.083 | 43 | 61 | 0.36 | ○ | NA |
| 19 | 0.093 | 1.254 | 1.347 | 220 | 155 | 0.63 | X | −28.8 |
| 20 | 0.055 | 0.671 | 0.726 | 340 | 277 | 0.47 | ○ | −31.7 |
| 21 | 0.086 | 1.096 | 1.182 | 45 | 160 | 0.56 | ○ | −27.2 |
| 22 | 0.079 | 0.919 | 0.998 | 335 | 281 | 0.5 | ○ | −33.3 |
| 23 | 0.114 | 1.352 | 1.466 | 47 | 158 | 0.56 | ○ | −32.6 |

*○ no discoloration; X discoloration

Test Methods

Grain Size Number

The drums used for preparation of the electrodeposited copper foil can readily be obtained with a specific grain size number. The grain size number can also be determined by using standard test method JIS G0552.

Volume Parameters

The volume parameters in the Table were obtained by a procedure in accordance with ISO 25178-2 (2012). Surface texture analysis was performed of images of a laser microscope. The laser microscope was a LEXT OLS5000-SAF manufactured by Olympus and the images were made at an air temperature of 24±3° C. and a relative humidity of 63±3%. The filter setting was set to unfiltered. The light source was a 405 nm-wavelength source. The objective lenses were 100× magnification (MPLAPON-100×LEXT). The optical zoom was set to 1.0×. The image area was set to 129 μm×129 μm. The resolution was set to 1024 pixels× 1024 pixels. The condition was set to auto tilt removal.

The Vvc was calculated with the material ratios of p and q where p is 10% and q is 80%, Vvv was calculated with a material ratio of 80%, and Vv was calculated with material ratio of 10%. The unit of the void volume is $\mu m^3/\mu m^2$.

Nickel Areal Density

A sample of the surface-treated copper foil was sized to 100×100 mm (area=1 $dm^2$). A protective layer was coated on the non-roughened side of the sample to prevent its dissolution. The sample was then dissolved with 20 ml of 18% HCl solution for 10 minutes. This procedure selectively dissolves the treatment layer. The solution was poured into a 50 ml volumetric flask and the nickel content was determined using ICP-OES with a carrier gas of argon and a nebulizer flow rate of 0.5 L/min. The nickel content in $\mu g$ for the sample is the nickel areal density in $\mu g/dm^2$ as reported in the Table.

Heat Resistance

A sample of the surface-treated copper foil was sized to 200×200 mm. The 200×200 mm sample was placed in an oven set at 225° C. After 15 minutes, the sample was examined to determine if the treated side showed coloration indicative of oxidation.

Peel Strength

A sample of surface-treated copper foil was placed on a resin substrate (Megtron6 from Panasonic corporation), positioned so that the nodule layer of the copper foil contacts the resin substrate. The resin and copper foil were then placed into a vacuum press machine and laminated together using a pressure of 30 $kg/cm^2$ and at temperature of 190° C., which were applied for 120 minutes. This provides a copper clad laminate (CCL). The peel strength was then evaluated using IPC-TM-650.

Hydrogen/Oxygen Content

The hydrogen and oxygen contents were measured for the samples of surface-treated copper foils using an Oxygen/Nitrogen/Hydrogen Analyzer (EMGA-930, manufactured by Horiba Ltd.) with non-dispersive infrared detector (NDIR).

Transmission Loss

The transmission characteristics were evaluated using a strip-line resonator technique. A copper foil was attached on a resin and further made into a strip-line, and this strip-line was used as source electrode. The thickness of the resin (S7439G from SyTech Corporation) was 152.4 $\mu m$, and had Dk=3.74 and Df=0.006 under 10 GHz signal test by IPC-TM 650 No. 2.5.5.5. The strip-line had a length=100 mm, width=120 $\mu m$, and thickness=18 $\mu m$.

After the strip-line was made, two surfaces were covered with two other resins (S7439G from SyTech Corporation), respectively, and two other copper foils were disposed on the resins as ground electrode. This assembly was without coverlay film and has a characteristic impedance of about 50Ω. Comparison of the signals transferred by the strip-line and the ground electrode provides the transmission Loss.

The measurement of the strip line and ground electrode was done using an Agilent PNA N5230C network analyzer. The frequency range used was 200 MHz to 15 GHz, the sweep number was 6401 point, the calibration was TRL and the test method was the Cisco S method. The measured values correspond to transmission losses (dB/m) at 10 GHz.

As used herein the term "comprising" or "comprises" is used in reference to compositions, methods, and respective component(s) thereof, that are essential to the claimed invention, yet open to the inclusion of unspecified elements, whether essential or not.

As used herein the term "consisting essentially of" refers to those elements required for a given embodiment. The term permits the presence of elements that do not materially affect the basic and novel or functional characteristic(s) of that embodiment of the claimed invention.

The term "consisting of" refers to compositions, methods, and respective components thereof as described herein, which are exclusive of any element not recited in that description of the embodiment.

As used in this specification and the appended claims, the singular forms "a," "an," and "the" include plural references unless the context clearly dictates otherwise. Thus for example, references to "the method" includes one or more methods, and/or steps of the type described herein and/or which will become apparent to those persons skilled in the art upon reading this disclosure and so forth. Similarly, the word "or" is intended to include "and" unless the context clearly indicates otherwise.

Other than in the operating examples, or where otherwise indicated, all numbers expressing quantities of ingredients or reaction conditions used herein should be understood as modified in all instances by the term "about." The term "about" when may mean±5% (e.g., ±4%, ±3%, ±2%, ±1%) of the value being referred to.

Where a range of values is provided, each numerical value between and including the upper and lower limits of the range is contemplated as disclosed herein. It should be understood that any numerical range recited herein is intended to include all sub-ranges subsumed therein. For example, a range of "1 to 10" is intended to include all sub-ranges between and including the recited minimum value of 1 and the recited maximum value of 10; that is, having a minimum value equal to or greater than 1 and a maximum value of equal to or less than 10. Because the disclosed numerical ranges are continuous, they include every value between the minimum and maximum values. Unless expressly indicated otherwise, the various numerical ranges specified in this application are approximations.

Unless otherwise defined herein, scientific and technical terms used in connection with the present application shall have the meanings that are commonly understood by those of ordinary skill in the art. Further, unless otherwise required by context, singular terms shall include pluralities and plural terms shall include the singular.

It should be understood that this invention is not limited to the particular methodology, protocols, and reagents, etc., described herein and as such may vary. The terminology used herein is for the purpose of describing particular embodiments only, and is not intended to limit the scope of the present invention, which is defined solely by the claims.

Any patents, patent applications, and publications including ASTM, JIS methods identified that are disclosed herein are expressly incorporated herein by reference for the purpose of describing and disclosing, for example, the methodologies described in such publications that can be used in connection with the present invention. These publications are provided solely for their disclosure prior to the filing date of the present application. Nothing in this regard should be construed as an admission that the inventors are not entitled to antedate such disclosure by virtue of prior invention or for any other reason. All statements as to the date or representation as to the contents of these documents is based on the information available to the applicants and does not constitute any admission as to the correctness of the dates or contents of these documents.

We claim:

1. A surface-treated copper foil comprising:
   an electrodeposited copper foil including a drum side and a deposited side, and a treatment layer disposed on one of the drum side and the deposited side, and the treatment layer providing a surface-treated side, wherein the treatment layer comprises a nodule layer and wherein the surface-treated side exhibits a void volume (Vv) in a range of 0.1 to 0.9 $\mu m^3/\mu m^2$ and, wherein a combined hydrogen and oxygen content of the surface-treated copper foil is in the range of 0 ppm and less than or equal to 300 ppm.

2. The surface-treated copper foil of claim 1, wherein the combined oxygen and hydrogen content is in the range of at least 50 ppm to less than or equal to 300 ppm.

3. The surface-treated copper foil of claim 1, wherein the void volume (Vv) is in the range of at least 0.1 $\mu m^3/\mu m^2$ to less than or equal to 0.7 $\mu m^3/\mu m^2$.

4. The surface-treated copper foil of claim 1, wherein the treatment layer further comprises a barrier layer including nickel, and a nickel areal density of the treatment layer is in a range of 40 to 200 $\mu g/dm^2$.

5. The surface-treated copper foil of claim 4, wherein the void volume (Vv) is in the range of at least 0.1 $\mu m^3/\mu m^2$ to less than or equal to 0.7 $\mu m^3/\mu m^2$.

6. The surface-treated copper foil of claim 4, wherein the nickel areal density is in the range of at least 40 $\mu g/dm^2$ to less than or equal to 120 $\mu g/dm^2$.

7. The surface-treated copper foil of claim 1, wherein the surface treated side exhibits a core void volume (Vvc) in a range of 0.08 to 0.84 $\mu m^3/\mu m^2$.

8. The surface-treated copper foil of claim 1, wherein the surface treated side exhibits a dale void volume (Vvv) in a range of 0.01 to 0.07 $\mu m^3/\mu m^2$.

9. The surface-treated copper foil of claim 1, wherein the treatment layer is on the deposited side.

10. The surface-treated copper foil of claim 1, wherein the treatment layer is on the drum side.

11. The surface-treated copper foil of claim 1, wherein the treatment layer is a first treatment layer, and the surface-treated copper foil further comprises a second treatment layer disposed on one of the drum side and the deposited side, where the first treatment layer and second treatment layer are not disposed on the same side of the electrodeposited copper foil.

12. The surface-treated copper foil of claim 11, wherein the second treatment layer does not comprise a nodule layer.

13. The surface-treated copper foil of claim 1, wherein the treatment layer further comprises at least one of a cover layer, a barrier layer, an anti-tarnish layer, and a coupling layer.

14. The surface-treated copper foil of claim 13, wherein the cover layer comprises copper.

15. The surface-treated copper foil of claim 13, wherein the barrier layer comprises one or more sub-layers wherein each sub-layer independently comprises a metal or alloy containing the metal, and the metal is selected from at least one of Ni, Zn, Cr, Co, Mo, Fe, Sn, and V.

16. The surface-treated copper foil of claim 13, wherein the anti-tarnish layer comprises chromium.

17. The surface-treated copper foil of claim 13, wherein the coupling layer includes silicon.

18. The surface-treated copper foil of claim 1, wherein the nodule layer comprises copper nodules.

19. A laminate comprising:
a surface-treated copper foil and a resin layer in contact with a surface-treated side of the surface-treated copper foil;
the surface-treated copper foil comprising,
an electrodeposited copper foil including a drum side and a deposited side,
a treatment layer disposed on one of the drum side and the deposited side, and the treatment layer providing the surface-treated side, wherein the treatment layer comprises a nodule layer, and wherein the surface-treated side exhibits a void volume (Vv) in a range of 0.1 to 0.9 $\mu m^3/\mu m^2$,
wherein a combined hydrogen and oxygen content of the surface-treated copper foil is less than or equal to 300 ppm, and wherein the surface-treated copper foil has a nickel areal density in a range of 40 to 200 $\mu g/dm^2$.

20. A device comprising,
a circuit board comprising the surface-treated copper foil of claim 1 and a plurality of components mounted on the circuit board,
wherein at least a first component and a second component of the plurality of components are electrically connected to each other through the surface-treated copper foil of the circuit board.

* * * * *